US008289106B2

(12) United States Patent
Kuroda et al.

(10) Patent No.: US 8,289,106 B2
(45) Date of Patent: Oct. 16, 2012

(54) ACOUSTIC WAVE DEVICE AND SYSTEM (75) Inventors: Yasushi Kuroda, Yokohama (JP); Akira Moriya, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 446 days.

(21) Appl. No.: 12/551,092

(22) Filed: Aug. 31, 2009

(65) Prior Publication Data

US 2010/0052819 A1 Mar. 4, 2010

(30) Foreign Application Priority Data

Sep. 2, 2008 (JP) ................................. 2008-225314

(51) Int. Cl.
 *H03H 9/64* (2006.01)
(52) U.S. Cl. ........................................ 333/195; 333/193
(58) Field of Classification Search .......... 333/193–196, 333/150–154; 310/313 R
See application file for complete search history.

(56) References Cited

U.S. PATENT DOCUMENTS

| | | | | |
|---|---|---|---|---|
| 3,582,840 A | * | 6/1971 | DeVries | 333/193 |
| 3,600,710 A | * | 8/1971 | Adler et al. | 333/193 |
| 4,143,343 A | * | 3/1979 | Inoue et al. | 333/194 |
| 4,223,284 A | * | 9/1980 | Inoue et al. | 333/150 |
| 5,363,073 A | * | 11/1994 | Higgins, Jr. | 333/195 |
| 5,363,074 A | * | 11/1994 | Higgins, Jr. | 333/195 |
| 5,568,002 A | * | 10/1996 | Kawakatsu et al. | 310/313 B |
| 5,994,980 A | | 11/1999 | Tada | |
| 6,710,676 B2 | * | 3/2004 | Yata et al. | 333/133 |
| 6,791,437 B2 | * | 9/2004 | Hagn et al. | 333/195 |
| 7,012,480 B2 | * | 3/2006 | Nakamura et al. | 333/133 |
| 2006/0181369 A1 | * | 8/2006 | Shibahara | 333/195 |
| 2007/0279157 A1 | * | 12/2007 | Bauer | 333/195 |
| 2008/0122552 A1 | * | 5/2008 | Ouchi | 333/5 |
| 2008/0246560 A1 | * | 10/2008 | Detlefsen | 333/195 |

FOREIGN PATENT DOCUMENTS

| | | | |
|---|---|---|---|
| DE | 10 2004 048 715 A1 | * | 4/2006 |
| JP | 55-3281 | * | 1/1980 |
| JP | 56-141613 | * | 11/1981 |
| JP | 58-205320 | * | 11/1983 |
| JP | 3-295308 | * | 12/1991 |
| JP | 10117123 A | | 5/1998 |
| JP | 11-97966 | * | 4/1999 |
| JP | 2000091883 A | | 3/2000 |
| JP | 2006229487 A | | 8/2006 |
| JP | 2006237727 A | | 9/2006 |

* cited by examiner

*Primary Examiner* — Barbara Summons
(74) *Attorney, Agent, or Firm* — Chen Yoshimura LLP (57) ABSTRACT

An acoustic wave device includes: a piezoelectric substrate; at least five IDTs (InterDigital Transducers) arranged on the substrate in directions of SAW (Surface Acoustic Wave) propagation; and two balanced terminals connected to two first IDTs that are two out of the at least five IDTs and are 180 degrees out of phase. One of a pair of comb electrodes of one of the two first IDTs is connected to one of the two balanced terminals, and one of a pair of comb electrodes of the other one of the two first IDTs being connected to the other one of the two balanced terminals. The other comb electrodes of the two first IDTs are connected in series, and one of a pair of comb electrodes that form an IDT that is included in the at least five IDTs and is not connected to the two first IDTs is grounded.

8 Claims, 12 Drawing Sheets

ACOUSTIC WAVE DEVICE AND SYSTEM

CROSS-REFERENCE TO RELATED APPLICATION

This application is based upon and claims the benefit of priority of the prior Japanese Patent Application No. 2008-225314, filed on Sep. 2, 2008, the entire contents of which are incorporated herein by reference.

FIELD

A certain aspect of the embodiments discussed herein is related to an acoustic wave device and a system using multiple acoustic wave devices.

BACKGROUND

Wireless communication devices, which may typically be portable phones, may have an arrangement in which an antenna receives and sends an unbalanced signal, while an amplifier inputs and outputs balanced signals. An acoustic wave device is provided as a filter between the antenna and the amplifier may be equipped with a function of converting electrical signals that are balanced about ground to signals that are unbalanced and vice versa, that is, the function of balun.

Figure 1A:
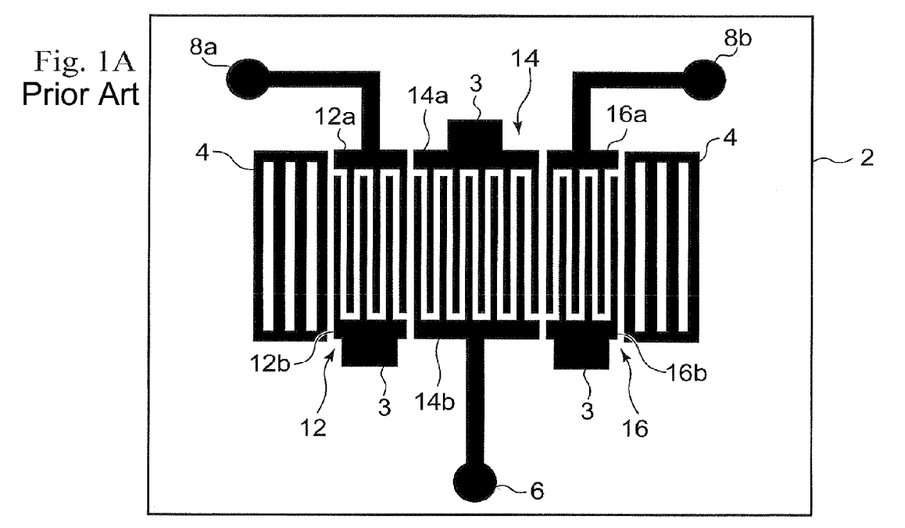
FIGS. 1A and 1B are plan view of related SAW devices.
Figure 1B:
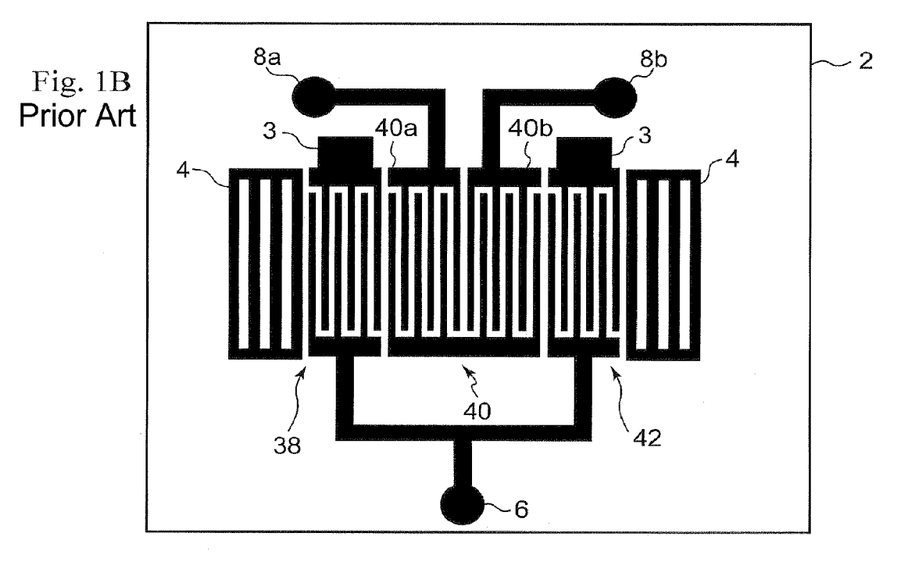

FIGS. 1A and 1B are plan views of related Surface Acoustic Wave (SAW) devices.

Referring to FIG. 1A, the device has a piezoelectric substrate 2 made of a piezoelectric substance such as $LiNbO_3$ or $LiTaO_3$, on which there are provided reflectors 4 and InterDigital Transducers (IDTs) 12, 14 and 16 arranged in directions of SAW propagation. The reflectors 4 are provided at opposite sides of a set of IDTs 12, 14 and 16, and reflect the surface acoustic waves to confine the surface acoustic waves in the set of IDTs 12, 14 and 16. Each of the IDTs 12, 14 and 16 is composed of a pair of comb electrodes that are interleaved. The IDT 14 has a pair of comb electrodes 14a and 14b. The comb electrode 14b of the IDT 14 is connected to an unbalanced terminal 6, and the comb electrode 14a thereof is connected to a ground terminal 3. The IDT 12 and IDT 16 are 180 degrees out of phase, and are composed of pairs of comb electrodes 12a and 12b and 16a and 16b, respectively. The comb electrodes 12a and 16a of the IDTs 12 and 16 are connected to balanced terminals 8a and 8b, respectively. The comb electrodes 12b and 16b of the IDTs 12 and 16 are connected to ground terminals 3, respectively. An unbalanced signal that is input via the unbalanced terminal 6 is output via the balanced terminals 8a and 8b as balanced signals. That is, the SAW device illustrated in FIG. 1A functions as a balun.

As illustrated in FIG. 1B, IDTs 38, 40 and 42 are provided in the directions of SAW propagation. The unbalanced terminal 6 is connected to the IDTs 38 and 42. One of a pair of comb electrodes that form the IDT 40 is divided into comb electrodes 40a and 40b, which are respectively connected to the balanced terminals 8a and 8b. The SAW device equipped with the IDT 40 having the divided comb electrodes has the balun function.

The antenna and the amplifier connected to the SAW device may have different impedances. It is thus required that the SAW device has not only the balun function but also an impedance converting function between the unbalanced terminal side and the balanced terminal side.

Japanese Laid-Open Patent Publication No. 10-117123 (Document 1) discloses a device equipped with a filter formed by cascading SAW filters that are 180 degrees out of phase and a filter formed by cascading SAW filters that are in phase. An unbalanced terminal is connected in parallel with the two filters, and balanced terminals are respectively connected to the two filters. With this structure, the output impedance is four times that of the input impedance and the balanced operation can be realized. Japanese Laid-Open Patent Publication No. 2006-229487 (Document 2) discloses an arrangement in which an unbalanced terminal is connected to four IDTs connected in parallel and balanced terminals are connected to divided IDTs. With this arrangement, the impedance ratio of the impedance of the unbalanced terminal side and that of the balanced terminal side is equal to 1:16. Japanese Laid-Open Patent Publication No. 2006-237727 (Document 3) discloses an arrangement in which an unbalanced terminal is connected to two filters in parallel, and each of two IDTs to which balanced terminals are connected are connected in series to other IDTs. With this arrangement, the impedance ratio of the impedance of the unbalanced terminal side and that of the balanced terminal side is equal to 1:16.

However, the arrangements disclosed in Documents 1 through 3 realize only limited impedance conversion ratios, namely, 1:4 and 1:16.

SUMMARY

According to an aspect of the present invention, there is provided an acoustic wave device including: a piezoelectric substrate; at least five IDTs (InterDigital Transducers) arranged on the substrate in directions of SAW (Surface Acoustic Wave) propagation; and two balanced terminals connected to two first IDTs that are two out of the at least five IDTs and are 180 degrees out of phase, one of a pair of comb electrodes of one of the two first IDTs being connected to one of the two balanced terminals, and one of a pair of comb electrodes of the other one of the two first IDTs being connected to the other one of the two balanced terminals, the other comb electrodes of the two first IDTs being connected in series, and one of a pair of comb electrodes that form an IDT that is included in the at least five IDTs and is not connected to the two first IDTs being grounded.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A description will now be given of embodiments with reference to the accompanying drawings.

First Embodiment

Figure 2A:
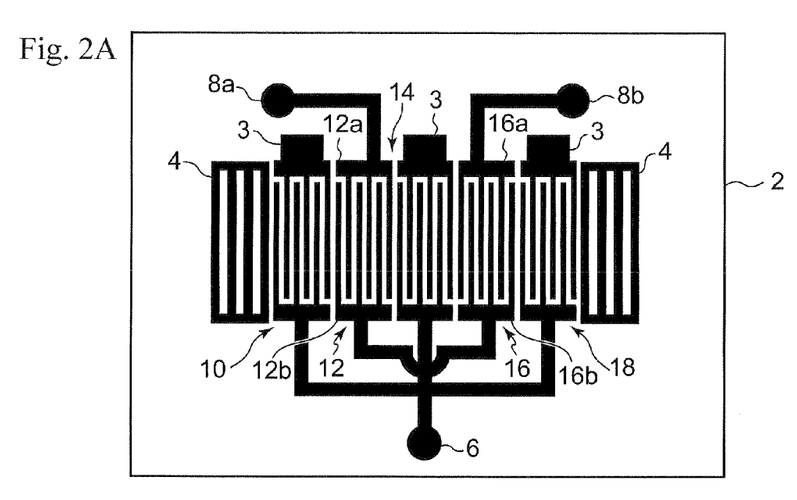
FIG. 2A is a plan view of a SAW device in accordance with a first embodiment.

FIG. 2A is a plan view of a SAW device in accordance with a first embodiment. The reflectors 4 and IDTs are illustrated with smaller numbers of electrode fingers than the actual numbers for the sake of simplicity. The distance between the electrode fingers of the reflectors 4 may be equal to that between the electrode fingers of each IDT.

A SAW device illustrated in FIG. 2A has the piezoelectric substrate 2 on which there are provided five IDTs 10, 12, 14, 16 and 18 and two reflectors 4 in the directions of SAW propagation (rightward and leftward directions). Among the five IDTs, three IDTs 10, 14 and 18 located at (2n+1)th (odd-numbered) positions from the right or left end of the group of the five IDTs arranged in a line are connected to the unbalanced terminal 6, and are connected in parallel. The two IDTs 12 and 16 located at 2nth (even-numbered) position are 180 degrees out of phase and are respectively connected to the balanced terminals 8a and 8b. That is, the SAW device in FIG. 2A has the function of balun.

Each of the IDTs includes a pair of comb electrodes that are interleaved. The comb electrode 12a of the IDT 12 is connected to the balanced terminal 8a, and the balanced electrode 16a of the IDT 16 is connected to the balanced terminal 8b. The other corn electrode 12b of the IDT 12 and the other comb electrode 16b of the IDT 16 are electrically floating and are connected in series. In other words, the IDT 12 and IDT 16 respectively connected to the balanced terminals 8a and 8b are connected in series, and the IDT 14 that is not connected to the IDT 12 and the IDT 14 is interposed between the IDT 12 and the IDT 16.

One of the comb electrodes in each of the IDTs 10, 14 and 18 is connected to the unbalanced terminal 6, and the other comb electrode is grounded. That is, among the pairs of comb electrodes of the IDTs 10, 14 and 18 that are not connected to the IDTs 12 and 16, one of each pair of comb electrodes is grounded, and the other comb electrode is connected to the unbalanced terminal 6.

According to the first embodiment, the three IDTs 10, 14 and 18 connected to the unbalanced terminal 6 are connected in parallel, and the two IDTs 12 and 16 connected to the balanced terminals 8a and 8b are connected in series. When each of the IDTs 10, 12, 14, 16 and 18 has an identical impedance, the impedance conversion ratio between the unbalanced terminal 6 and the balanced terminals 8a and 8b is set equal to 1:6. That is, the SAW device has the impedance converting function.

In a case where the IDTs 12 and 16 are designed to have an impedance of 75Ω and the IDTS 10, 14 and 18 are designed to have an impedance of 150Ω, the unbalanced terminal 6 has an impedance of 50Ω, and the balanced terminals 8a and 8b have an impedance of 150Ω. That is, the impedance conversion ratio between the unbalanced terminal 6 and the balanced terminals 8a and 8b is 1:3. The impedance conversion ratio additionally depends on the design of IDTs (number of electrode fingers and the aperture length). In practice, the impedance of IDT may further be affected by a parasitic capacitance around the IDT and an IDT that receives the surface acoustic wave.

Figure 2B:
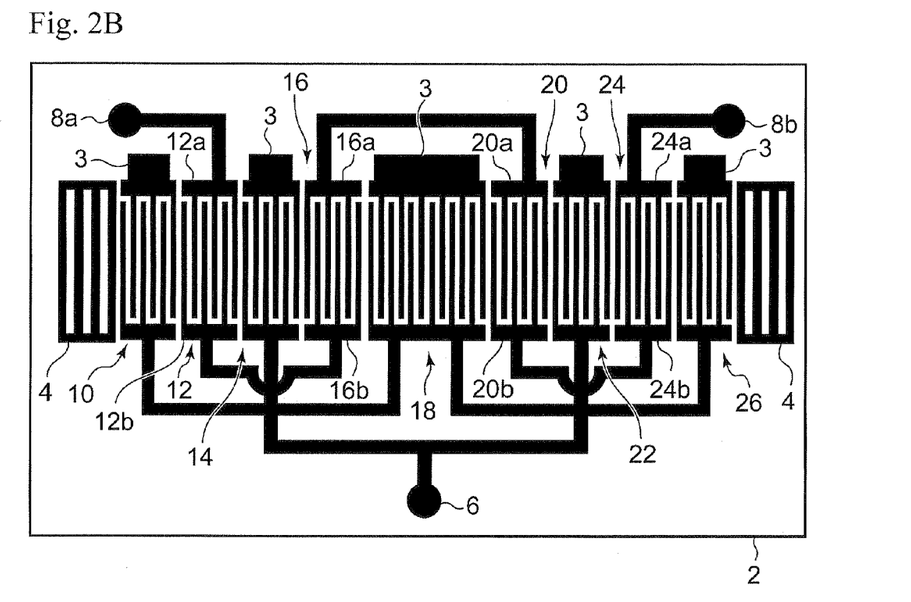
FIG. 2B is a plan view of a SAW device in accordance with a second embodiment.
Figure 3A:
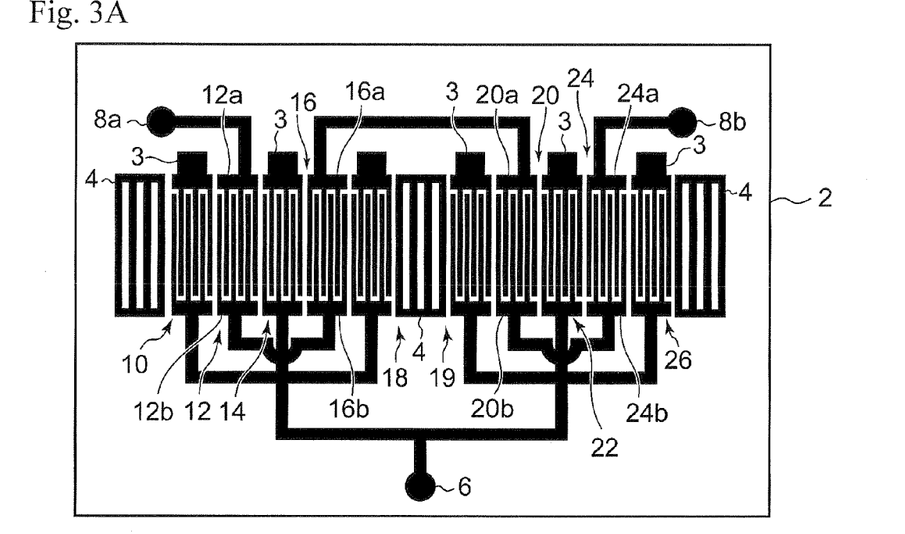
FIGS. 3A and 3B are plan views of SAW devices in accordance with variations of the first embodiment.
Figure 3B:
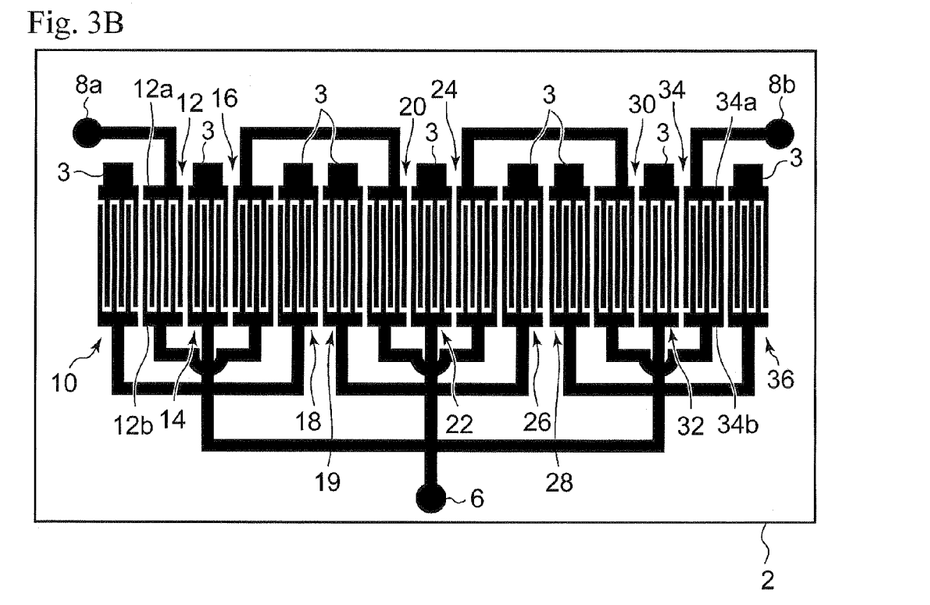

FIGS. 2B, 3A and 3B are plan views of variations of the first embodiment, in which parts that are the same as those previously described are given the same reference numerals.

Referring to FIG. 2B, among multiple IDTs, IDTs 10, 14, 18, 20, 22 and 26 located at (2n+1)th positions are connected to the unbalanced terminal 6 and are connected in parallel. The IDTs 12 and 24 are 180 degrees out of phase, and are respectively connected to the balanced terminals 8a and 8b. The IDTs 16 and 20 are 180 degrees out of phase, and IDTs 20 and 24 are 180 degrees out of phase.

The comb electrode 12a of the IDT 12 is connected to the balanced terminal 8a, and the comb electrode 24a of the IDT 24 is connected to the balanced terminal 8b. The other comb electrode of the IDT 12 and the comb electrode 16b of the IDT 16 are electrically floating, and are connected in series. Similarly, the other comb electrode 24b of the IDT 24 and a comb electrode 20b that is one of a pair of comb electrodes of the IDT 20 are electrically floating are connected in series. The other comb electrode 16a of the IDT 16 and the other comb electrode 20a of the IDT 20 are electrically floating and are connected in series. That is, the IDT 12 and IDT 24 respectively connected to the balanced terminals 8a and 8b are connected in series via the IDT 16 and the IDT 20.

According to the exemplary configuration illustrated in FIG. 2B, the number of parallel connections is doubled, as compared to the configuration illustrated in FIG. 2A, and the impedance of the unbalanced terminal 6 is halved. Further, since the number of series connections is doubled, the impedance of the balanced terminals 8a and 8b is doubled. That is, in a case where each IDT is designed to have an identical impedance, the impedance conversion ratio between the unbalanced terminal 6 and the balanced terminals 8a and 8b is set equal to 1:24 and is thus greater than that in the case of FIG. 2A.

Referring to FIG. 3A, the IDTs 10, 14, 18, 19, 22 and 26 are connected to the unbalanced terminal 6, and are connected in parallel. That is, even in case where the reflector 4 is provided between the IDT 18 and the IDT 19, the same impedance conversion function as illustrated in FIG. 2B can be realized.

As illustrated in FIG. 3B, IDTs 10, 14, 18, 19, 22, 26, 28, 32 and 36 are connected to the unbalanced terminal 6 and are connected in parallel. The comb electrode 12a of the IDT 12 is connected to the balanced terminal 8a, and a comb electrode that is one of a pair of comb electrodes of the IDT 34 is connected to the balanced terminal 8b. The IDTs 12 and 34 are connected in series via the IDTs 16, 20, 24 and 30. With the exemplary structure illustrated in FIG. 3B, it is possible to obtain a greater impedance conversion ratio than that obtained in FIG. 2B or FIG. 3A.

As described above, the first embodiment is designed to change the impedance conversion ratio by changing the number of IDTs that are connected to the unbalanced terminal and are connected in parallel, and the number of IDTs that are connected to the balanced terminals and are connected in series. According to the first embodiment, it is possible to realize the SAW device having the balun function and a greater degree of freedom of setting the impedance conversion ratio between the unbalanced terminal 6 and the balanced terminals 8a and 8b.

Second Embodiment

A second embodiment is configured to have divided comb electrodes of IDT.

Figure 4A:
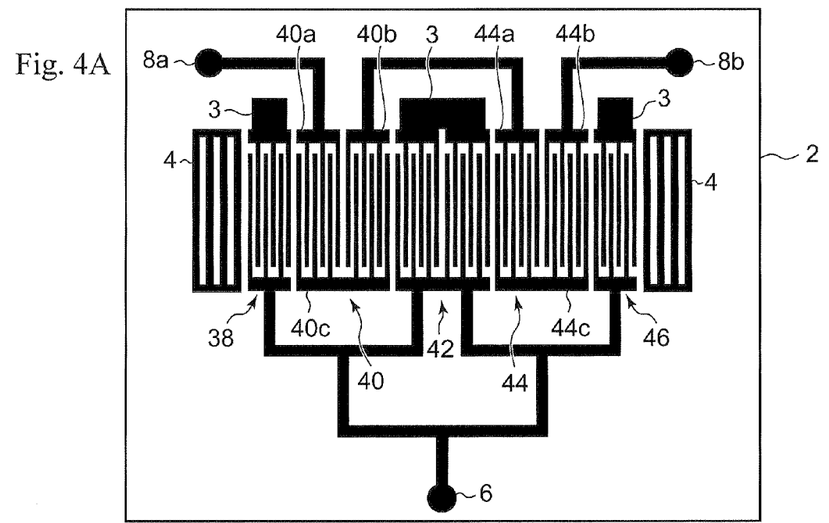
FIG. 4A is a plan view of a SAW device in accordance with a second embodiment.

FIG. 4A is a plan view of a SAW device in accordance with the second embodiment. Referring to FIG. 4A, IDTs 38, 40, 42, 44 and 46 are arranged in directions of SAW propagation along with the reflectors 4. One of a pair of comb electrodes that forms the IDT 40 is divided into comb electrodes 40a and 40b, which are 180 degrees out of phase. Similarly, one of a pair of comb electrodes that forms the IDT 44 is divided into comb electrodes 44a and 44b, which are 180 degrees out of phase.

The IDTs 38, 42 and 46 are connected to the unbalanced terminal 6, and are connected in parallel. That is, one of the pair of comb electrodes of each of the IDTs 38, 42 and 46 is grounded, and the other comb electrode thereof is connected to the unbalanced terminal 6.

The comb electrode 40a of the IDT 40 and the comb electrode 44b of the IDT 44 are 180 degrees out of phase, and are respectively connected to the balanced terminals 8a and 8b. The comb electrode 40b and the comb electrode 44a are electrically floating and are connected in series. The comb electrodes 40a and 40b are connected in series by another comb electrode 40c of the IDT 40. Similarly, the comb electrodes 44a and 44b are connected in series by another comb electrode 44c that forms the IDT 44. That is, the comb electrode 40a and the comb electrode 44b are connected in series.

According to the second embodiment, the four IDTs to which the unbalanced terminal 6 is connected are connected in parallel, and the comb electrodes 40a and 44b to which the balanced terminals 8a and 8b are connected respectively are connected in series. Thus, in a case where each IDT is designed to have an identical impedance, the impedance conversion ratio between the unbalanced terminal 6 and the balanced terminals 8a and 8b may be set equal to 1:16. As described above, one of the pair of comb electrodes of each of the predetermined IDTs is divided into two parts, ones being connected to the corresponding balanced terminals, and the others being connected to each other. Even with this structure, it is possible to realize the SAW device having the impedance converting function between the unbalanced terminal and the balanced terminals.

Figure 4B:
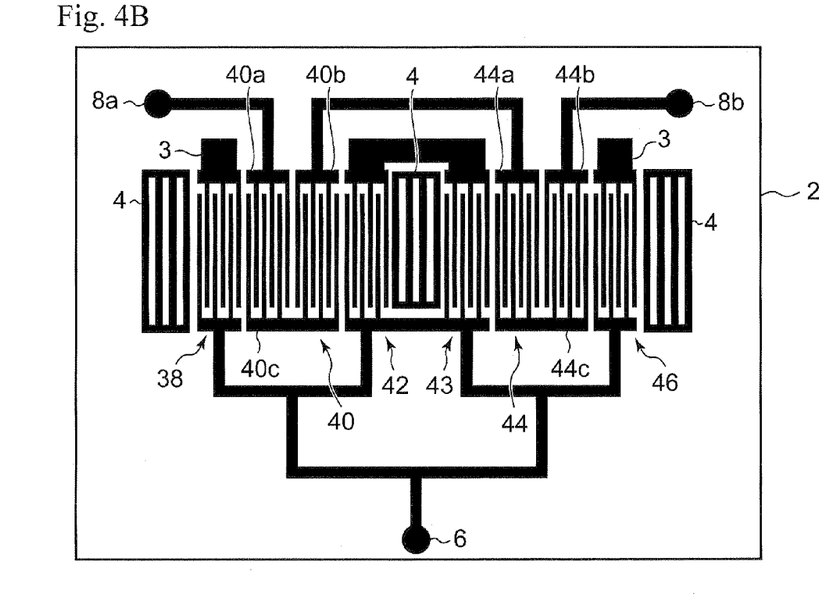
FIG. 4B is a plan view of a SAW device in accordance with a variation of the second embodiment.
Figure 5:
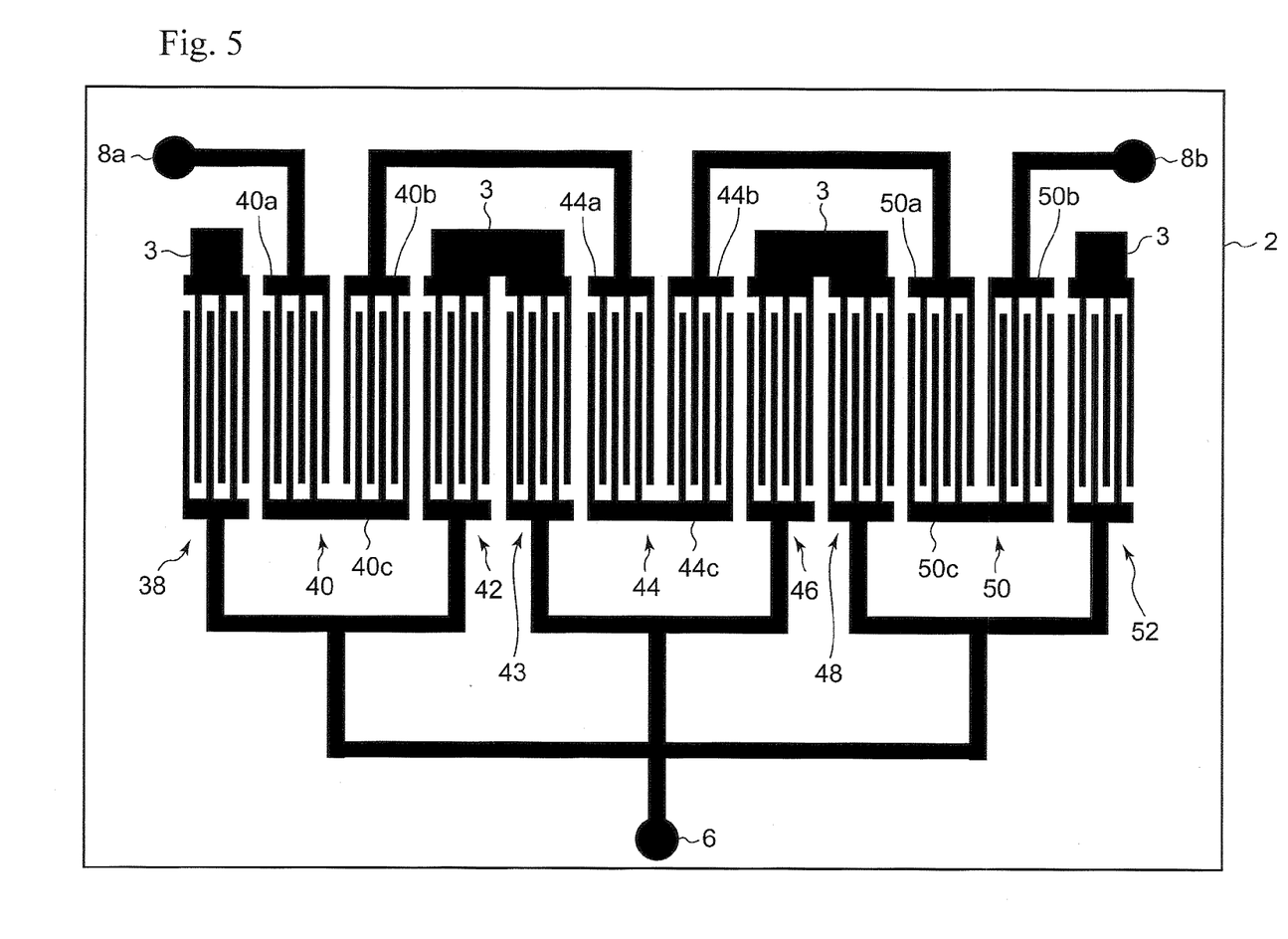
FIG. 5 is a plan view of a SAW device in accordance with another variation of the second embodiment.

FIGS. 4B and 5 are plan views of variations of the second embodiment. In FIG. 5, the reflectors 4 are omitted for the sake of simplicity.

Referring to FIG. 4B, IDTs 38, 42, 43 and 46 are connected to the unbalanced terminal 6 and are connected in parallel. The reflector 4 is provided between the IDT 42 and the IDT 43.

As illustrated in FIG. 5, IDTs 38, 42, 43, 46, 48 and 52 are connected to the unbalanced terminal 6 and are connected in parallel. Like the structures illustrated in FIGS. 4A and 4B, one of the pair of comb electrodes that form the IDT 40 is divided into the comb electrodes 40a and 40b. The balanced terminal 8a is connected to the divided comb electrode 40a. One of a pair of comb electrodes that form the IDT 50 is divided into comb electrodes 50a and 50b. The balanced terminal 8b is connected to the divided comb electrode 50b. One of the pair of comb electrodes that form the IDT 44 is divided into the comb electrodes 44a and 44b. The comb electrodes 40b and 44a are electrically floating and are connected in series, and the comb electrodes 50a and 44b are electrically floating and are connected in series. The comb electrodes 44a and 44b are connected in series by the other comb electrode 44c. That is, the comb electrodes 40a and 50b are connected in series.

According to the second embodiment, it is possible to change the impedance conversion ratio by changing the number of IDTs that are connected to the unbalanced terminal and are connected in parallel and the number of IDTs, each of which is connected to the corresponding balanced terminal and includes one electrode divided into two that are connected in series via the other electrode. That is, it is possible to provide the SAW device having he balun function and a greater degree of freedom of setting the impedance conversion ratio between the unbalanced terminal 6 and the balanced terminals 8a and 8b.

The exemplary structure illustrated in FIG. 5 has nine IDTs. However, the second embodiment may be applied to a device equipped with at least three IDTs.

Third Embodiment

A third embodiment will now be described. In the first embodiment, the second IDT from the either end is connected to the balanced terminals (see FIGS. 2A through 3B). In contrast, the third embodiment has an exemplary configuration in which odd-numbered IDTs from the either end are connected to the balanced terminals, and each of the IDTs connected to the unbalanced terminal includes an even number of electrode fingers.

In FIG. 1A described previously, the IDT 14 having an even umber of electrode fingers is connected to the unbalanced terminal 6. Each of the IDTs 12, 14 and 16 is equipped with an even number of electrode fingers, and the IDTs 12 and 16 are 180 degrees out of phase. In the third embodiment, multiple SAW devices, each of which is configured as illustrated in FIG. 1A, are connected.

Figure 6A:
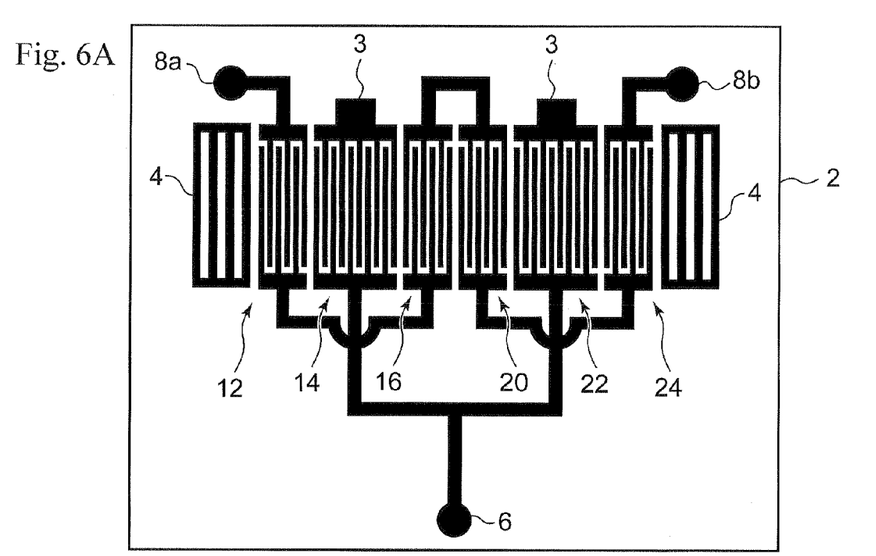
FIG. 6A is a plan view of a SAW device in accordance with a third embodiment.

FIG. 6A is a plan view of a SAW device in accordance with the third embodiment. As illustrated in FIG. 6A, among multiple IDTs, the IDTs 14 and 22 located at the second positions from either end are connected to the unbalanced terminal 6 and are connected in parallel. The IDTs 12 and 24 located at the first and third positions from the either end are respectively connected to the balanced terminals 8a and 8b and are respectively connected in series via the IDTs 16 and 20. In other words, the IDTs 12 and 24 respectively connected to the balanced terminals 8a and 8b are connected in series, and the IDTs 14 and 22, which are not connected to the IDTs 12 and 24, are interposed between the IDTs 12 and 24.

Figure 6B:
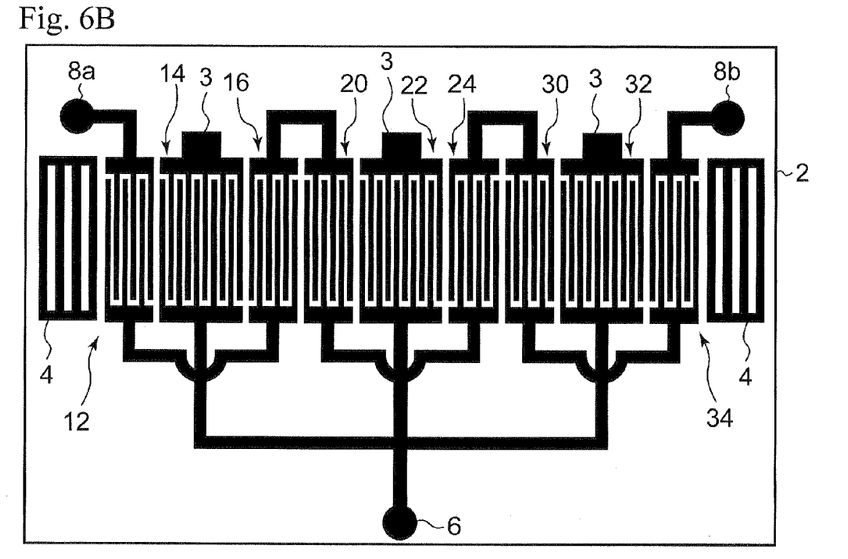
FIG. 6B is a plan view of a SAW device in accordance with a variation of the third embodiment.

FIG. 6B is a plan view of a variation of the third embodiment. As illustrated in FIG. 6B, IDTs 14, 22 and 32 are connected to the unbalanced terminal 6 and are connected in parallel. The IDTs 12 and 34 are respectively connected to the balanced terminals 8a and 8b and are connected in series via the IDTs 16, 20, 24 and 30. In FIGS. 6A and 6B, each IDT has an even number of electrode fingers.

Figure 7A:
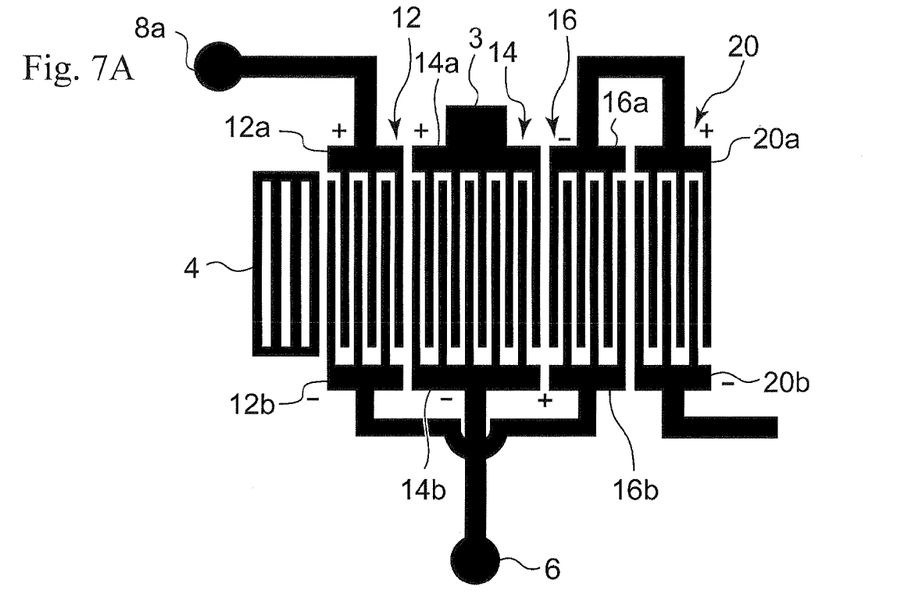
FIGS. 7A and 7B are enlarged views of variations of the third embodiment.

FIG. 7A is an enlarged view of an area including IDTs 12, 14, 16 and 20 in FIG. 6A or FIG. 6B. Referring to FIG. 7A, in a case whether the comb electrode 14b of the IDT 14 connected to the unbalanced terminal 6 has a negative polarity, the comb electrodes 12b, 12a, 14a, 16a, 16b, 20b and 20a have polarities of −, +, +, −, +, − and +, respectively. Since the comb electrodes 12a and 16a have opposite polarities, these electrodes are 180 degrees out of phase. Further, comb electrodes of an identical polarity are not juxtaposed to each other, and the surface acoustic waves excited thereby do not cancel each other. It is thus possible to obtain a greater output signal of the SAW device.

Figure 7B:
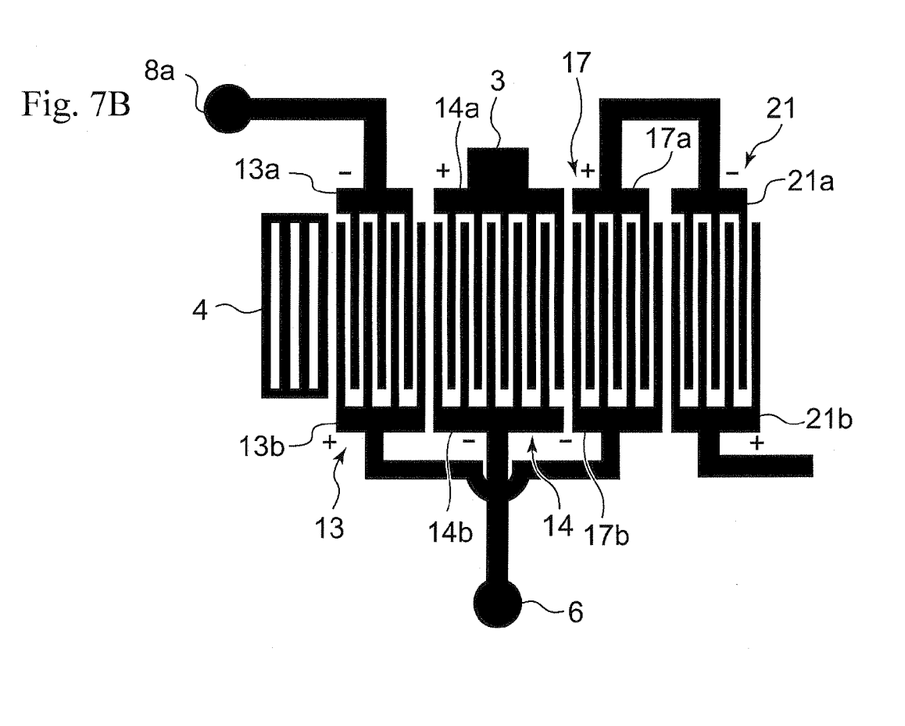

FIG. 7B is an enlarged view of a part of an area including IDTs 12, 14, 16 and 20 in a case where each of the IDTs 13, 17 and 21 in FIG. 6A or 6B has an odd number of electrode fingers. Although not illustrated in FIG. 7B, each of the IDTs connected to the balanced terminals and IDTs connected in series to these IDTs has an odd number of electrode fingers.

As illustrated in FIG. 7B, the balanced terminal 8*a* is connected to the IDT 13, and the IDTs 13, 17 and 21 are connected in series. In a case where the comb electrode 14*b* of the IDT 14 has the negative polarity, the comb electrodes 13*b*, 13*a*, 14*a*, 17*b*, 17*a*, 21*b* and 21*a* have polarities of +, −, +, −, +, +, and −, respectively. The comb electrodes 13*a* and 17*a* are provided so as to have the opposite polarities, and are thus 180 degrees out of phase. As in the case of FIG. 7A, the comb electrodes of the identical polarity, that is, those in phase are not juxtaposed to each other, and the surface acoustic waves excited thereby do not cancel each other.

According to the third embodiment, the SAW device configured to have the (2n+1)th IDTs connected to the balanced terminals functions as a balun and has a greater degree of freedom of impedance conversion.

Further, the comb electrodes that are in phase are not juxtaposed to each other irrespective of whether the IDTs connected to the balanced terminals and the IDTs connected in series to these IDTs have even numbers of electrode fingers or not, because the each of the IDTs connected to the unbalanced terminal has an even number of electrode fingers. It is thus possible to prevent the excited surface acoustic waves from canceling each other.

The structure illustrated in FIG. 6A has the six IDTs. However, the third embodiment may be applied to a device equipped with at least three IDTs. This device has not only the function of balun but also the function of impedance conversion.

Fourth Embodiment

A fourth embodiment is configured so that an IDT connected to the unbalanced terminal has an odd number of electrode fingers.

Figure 8:
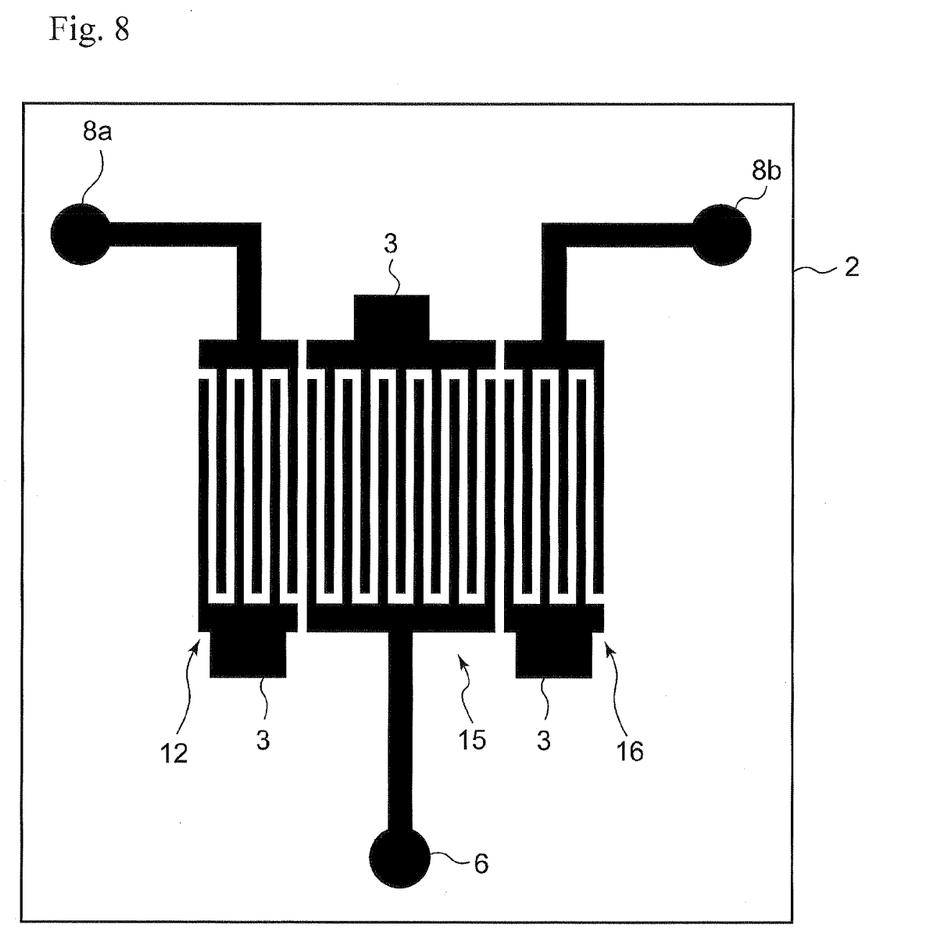
FIG. 8 is a plan view of a part of a SAW device in accordance with a fourth embodiment.

FIG. 8 is a plan view of a SAW device in which an IDT 15 having an odd number of electrode fingers is connected to the unbalanced terminal 6. Each of the IDTs 12 and 16 has an even number of electrode fingers, and the IDTs 12 and 16 are 180 degrees out of phase. The fourth embodiment employs multiple SAW devices, each of which is configured as illustrated in FIG. 8.

Figure 9A:
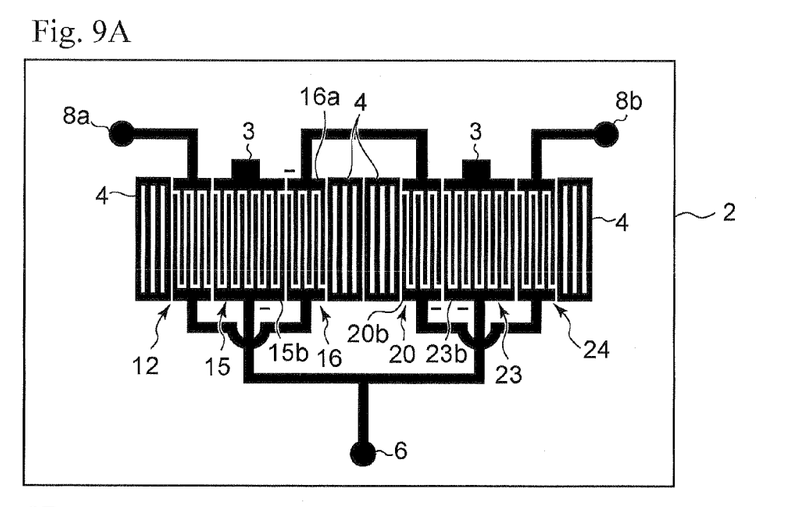
FIG. 9A is a plan view of a SAW device in accordance with the fourth embodiment.

FIG. 9A is a plan view of a SAW device in accordance with the fourth embodiment. As illustrated in FIG. 9A, IDTs 15 and 23 are connected to the unbalanced terminal 6, and are connected in parallel. The IDTs 12 and 24 are respectively connected to the balanced terminals 8*a* and 8*b*, and are respectively connected in series via the IDTs 16 and 20. In a case where the comb electrodes 15*b* and 23*b* connected to the unbalanced terminal 6 have the negative polarity, the comb electrodes 16*a* and 20*b* have the negative polarity. Thus, the IDTs that are in phase are juxtaposed to each other. The SAW propagated from the IDT 16 and that from the IDT 20 have the opposite phases and cancel each other. In order to restrain this cancellation, the reflectors 4 are provided so as to be juxtaposed to the IDTs 16 and 20. It is thus possible to prevent the surface acoustic waves from being propagated from the IDT 16 to the IDT 20 and from the IDT 20 to the IDT 16. Thus, cancellation of surface acoustic waves can be restrained, and the output of the SAW device can be enlarged.

Figure 9B:
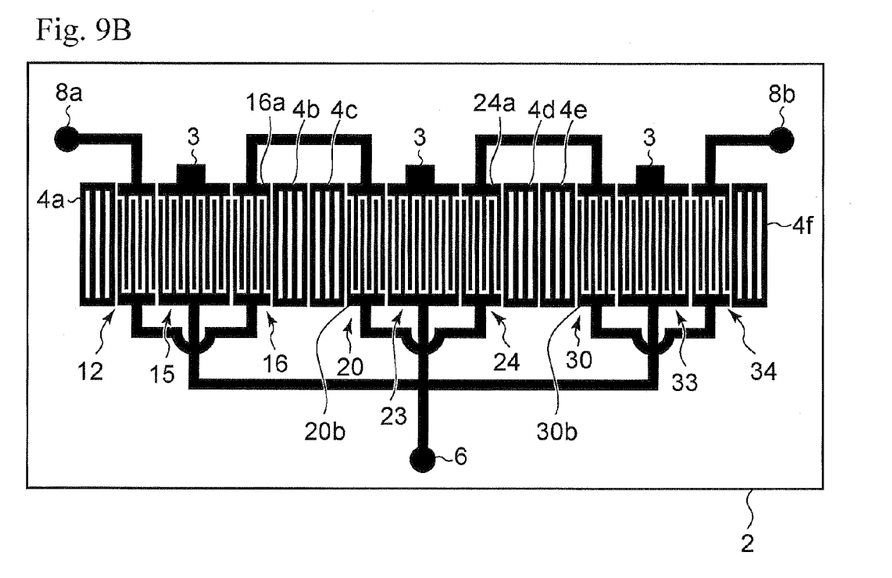
FIG. 9B is a plan view of a SAW device in accordance with a variation of the fourth embodiment.

FIG. 9B is a plan view of a SAW device in accordance with a variation of the fourth embodiment. The comb electrode 16*a* of the IDT 16 and the comb 20*b* of the IDT 20 are in phase, and the comb electrode 24*a* of the IDT 24 and the comb electrode 30*b* of the IDT 30 are in phase. Thus, as in the case of FIG. 9A, reflectors 4*b* and 4*c* are respectively provided so as to be juxtaposed to the IDTs 16 and 20, and reflectors 4*d* and 4*e* are respectively provided so as to be juxtaposed to the IDTs 24 and 30. Symbols 4*a* and 4*f* indicate reflectors juxtaposed to the IDTs 12 and 34, respectively. It is thus possible to restrain cancellation of the surface acoustic waves. In FIGS. 9A and 9B, each IDT other than the IDTs connected to the unbalanced terminal has an even number of electrode fingers.

Figure 10A:
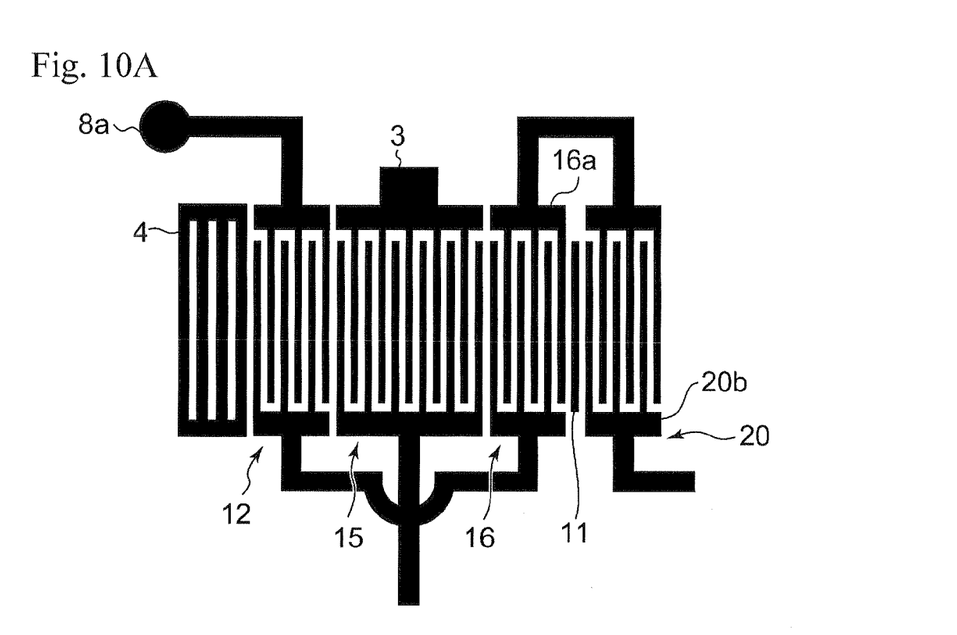
FIGS. 10A and 10B are enlarged views of variations of the fourth embodiment.

FIG. 10A is an enlarged view of a part of the variation of the fourth embodiment, the part corresponding to the parts illustrated in FIGS. 7A and 7B. In FIG. 10A, a floating electrode 11 is substituted for the reflector 4.

As illustrated in FIG. 10A, the floating electrode 11 is arranged so as to be juxtaposed to the IDTs 16 and 20, and prevents the comb electrodes 16*a* and 20*b* in phase from being juxtaposed to each other. Thus, the SAW propagated from the IDT 16 and that from the IDT 20 are in phase and are prevented from being cancelled.

Figure 10B:
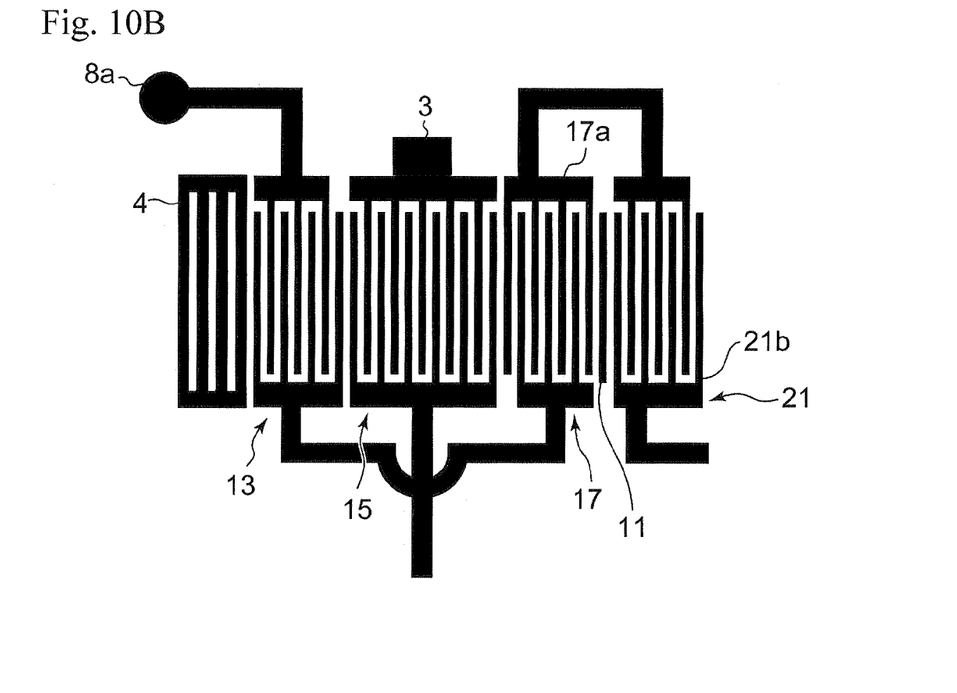

FIG. 10B illustrates an exemplary structure in which each IDT has an odd number of electrode fingers. As illustrated in FIG. 10B, the IDT 13 is connected to the balanced terminal 8*a*, and the IDTs 13 and 17 are 180 degrees out of phase. In this case, the comb electrode 17*a* of the IDT 17 and the comb electrode 21*b* of the IDT 21 are in phase. Thus, the floating electrode 11 juxtaposed to the IDTs 17 and 21 makes it possible to ring the surface acoustic waves propagated from the IDTs 17 and 21 in phase and to prevent cancellation of these surface acoustic waves.

According to the fourth embodiment, in the case where each IDT connected to the unbalanced terminal has an odd number of electrode fingers, the reflectors or floating electrodes are provided so as to be juxtaposed to the IDTs connected to the balanced terminals and the IDTs connected to the former IDTs in series. It is thus possible to bring the surface acoustic waves propagated from the above IDTs in phase and prevent cancellation of these surface acoustic waves.

Fifth Embodiment

A fifth embodiment employs balanced terminals instead of the unbalanced terminal.

Figure 11A:
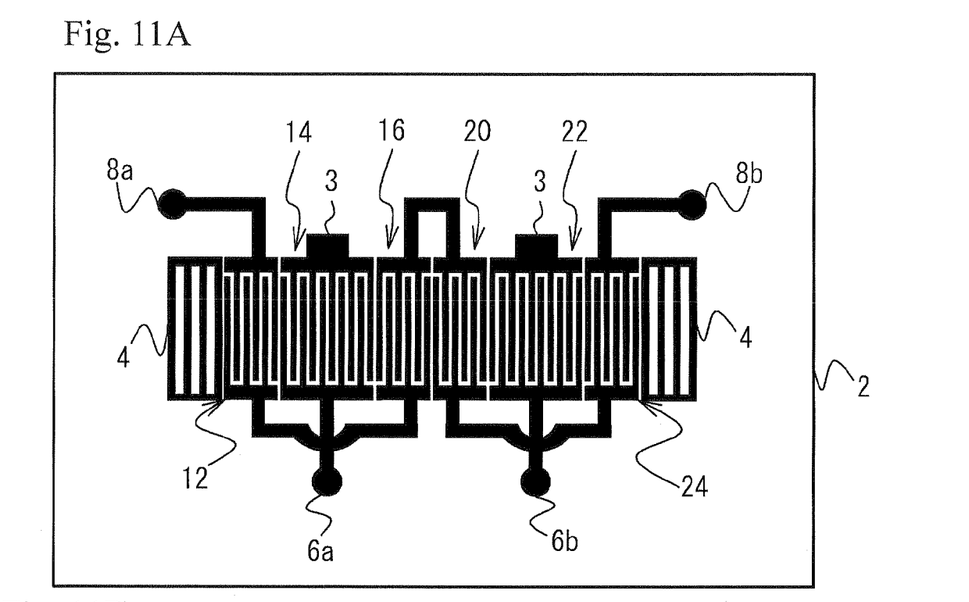
FIG. 11A is a plan view of a SAW device in accordance with a fifth embodiment.

FIG. 11A is a plan view of a SAW device in accordance with the fifth embodiment. The SAW device illustrated in FIG. 11A may be configured by varying the SAW device illustrated in FIG. 6A so that an additional balanced terminal 6*a* is connected to one of the pair of comb electrodes that form the IDT 14 and an additional balanced terminal 6*b* is connected to one of the pair of comb electrodes that form the IDT 22. The other comb electrodes of the IDTs 14 and 22 are grounded. That is, the SAW device is connected to two pairs of balanced terminals. The IDT 12 and the IDT 24 respectively connected to the balanced terminals 8*a* and 8*b* are connected in series via the IDTs 16 and 20. It is thus possible to realize the SAW device having the function of impedance conversion between the balanced terminals 6*a* and 6*b* and the balanced terminals 8*a* and 8*b*.

Figure 11B:
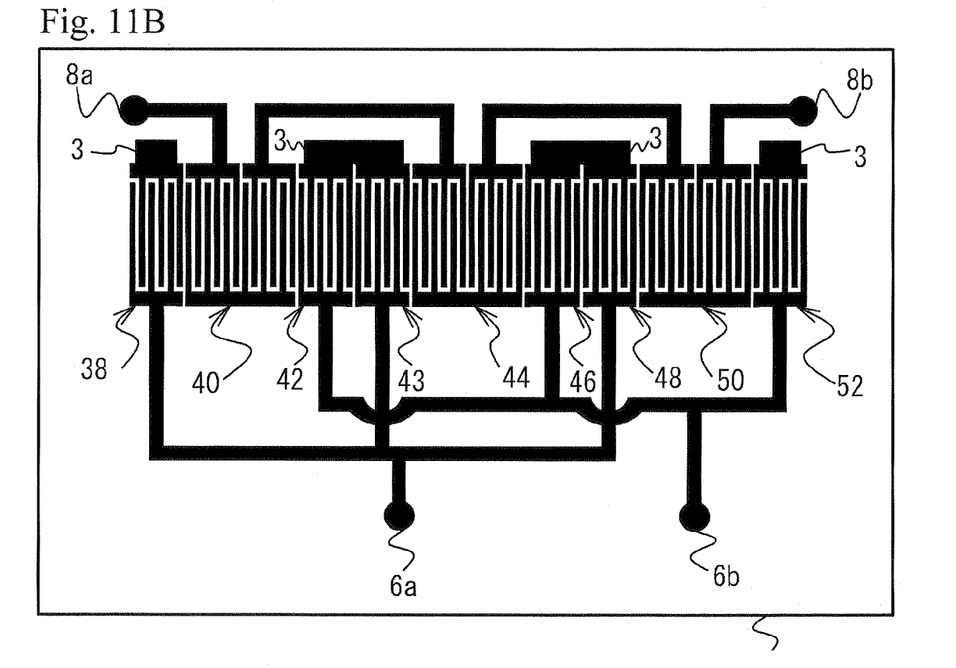
FIG. 11B is a plan view of a SAW device in accordance with a variation of the fifth embodiment.

FIG. 11B is a plan view of a SAW device in accordance with a variation of the fifth embodiment. The SAW device illustrated in FIG. 11B may be configured by varying the SAW device shown in FIG. 5 so that the balanced terminals 6a and 6b are substituted for the unbalanced terminal 6. IDTs 38, 43 and 48 are in phase. One of the pair of comb electrodes of each of IDTs 38, 42, 43, 46, 48 and 52 is grounded. The other comb electrode of each of the IDTs 38, 43 and 48 is connected to the balanced terminal 6a. The IDTs 42, 46 and 52 are in phase, and are 180 degrees out of phase with the IDT 38. The balanced terminal 6b is connected to the other comb electrode of each of the IDTs 42, 46 and 52. The structure in FIG. 11B is configured so that the balanced terminals 6a and 6b are involved in parallel connections, and has a greater impedance conversion ratio than that of the configuration illustrated in FIG. 11A.

According to the fifth embodiment, even in the case where the balanced terminals are substituted for the unbalanced terminal, it is possible to realize the SAW device having a great degree of freedom of impedance conversion.

The SAW devices illustrated in FIGS. 11A and 11B are exemplary devices, and similar effects can be obtained in the SAW devices other than those in FIGS. 5 and 6A in which the unbalanced terminal is replaced by the balanced terminals 6a and 6b.

Sixth Embodiment

A sixth embodiment is an exemplary SAW system configured by multiple SAW devices.

Figure 12A:
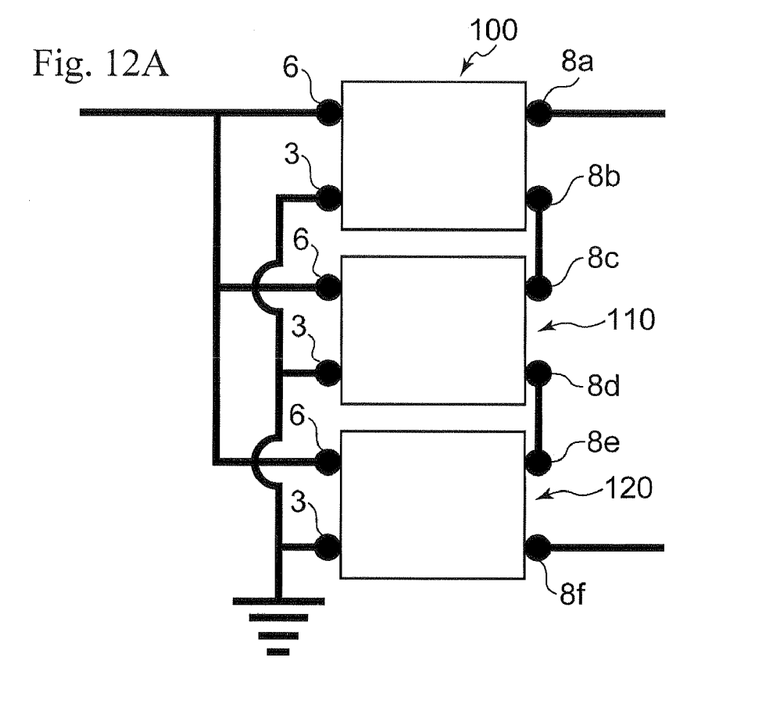
FIG. 12A is a block diagram of a SAW system in accordance with a sixth embodiment.

FIG. 12A is a block diagram of a SAW system in accordance with the sixth embodiment. A SAW system is composed of SAW devices 100, 110 and 120. The SAW devices 100, 110 and 120 have almost the same pass bands, and may be configured to have the structure of, for example, any of the first through fifth embodiments.

As illustrated in FIG. 12A, each of the SAW devices 100, 110 and 120 is connected to the respective unbalanced terminal 6 and the respective ground terminal 3. The unbalanced terminals 6 of the SAW devices 100, 110 and 120 are connected in parallel. The SAW device 100 is connected to the balanced terminals 8a and 8b, at which signals are 180 degrees out of phase. Similarly, the SAW device 110 is connected to balanced terminals 8c and 8d, and the SAW device 120 are connected to balanced terminals 8e and 8f. The balanced terminals 8a, 8c and 8e are in phase, and the balanced terminals 8b, 8d and 8f are in phase. Among the balanced terminals, the balanced terminals 8b and 8c are connected in series, and the balanced terminals 8d and 8e are connected in series. That is, the SAW devices 100, 110 and 120 are connected by connecting the balanced terminals that are 180 degrees out of phase, so that the entire structure has the balanced terminals 8a and 8f. Thus, the unbalanced terminals of the SAW devices 100, 110 and 120 are connected in parallel, while the balanced terminals are connected in series.

According to the sixth embodiment, the impedance conversion ratio can be changed by changing the number of SAW devices connected and changing the configurations of the SAW devices (for example, employing any of the structures of the first through fifth embodiments). It is thus possible to realize the SAW system having the function of balun and a greater degree of freedom of impedance conversion.

Figure 12B:
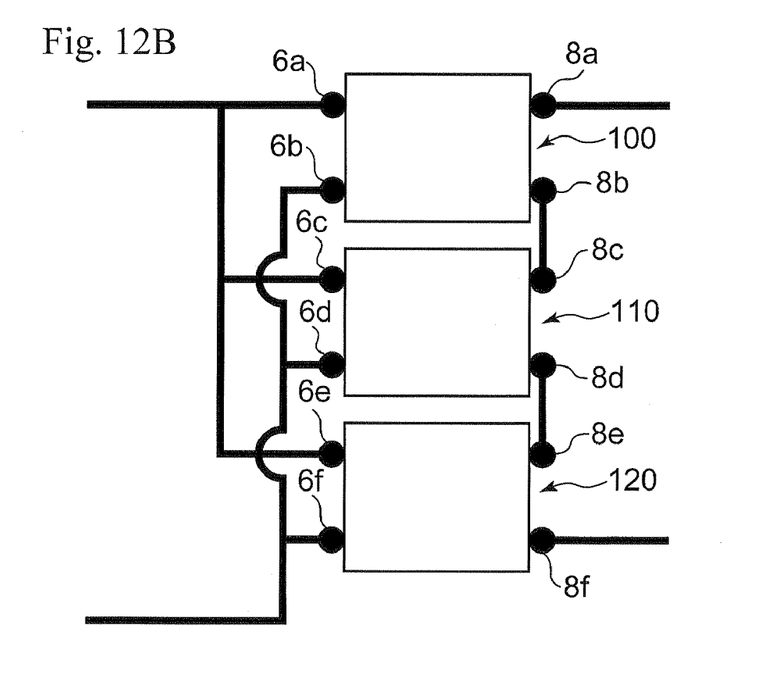
FIG. 12B is a block diagram of a SAW system in accordance with a variation of the sixth embodiment.

FIG. 12B is a block diagram of a SAW system in accordance with a variation of the sixth embodiment. The present SAW system includes the SAW devices 100, 110 and 120, each of which is connected to two pairs (first and second pairs) of balanced terminals, as exemplarily illustrated in FIGS. 11A and 11B. The SAW devices 100, 110 and 120 have almost the same pass bands.

As illustrated in FIG. 12B, the SAW device 100 is connected to the pair of balanced terminals 6a and 6b that are 180 degrees out of phase and the pair of balanced terminals 8a and 8b that are 180 degrees out of phase. Similarly, the SAW device 110 is connected to the pair of balanced terminals 6c and 6d and the pair of balanced terminals 8c and 8d, and the SAW device 120 is connected to the pair of balanced terminals 6e and 6f and the pair of balanced terminals 8e and 8f. The balanced terminals 6a, 6c and 6e are in phase, and the balanced terminals 6b, 6d and 6f are in phase. Among the balanced terminals 6a through 6f, the balanced terminals 6a, 6c and 6e are connected in parallel and the balanced terminals 6b, 6d and 6f are connected in parallel. As in the case of FIG. 12A, the balanced terminals 8b and 8c are connected in series, and the balanced terminals 8d and 8e are connected in series. The SAW devices 100, 110 and 120 are connected so that the comb electrodes of the first pairs that are in phase are connected to each other, and the second pairs of comb electrodes are connected in series so that the entire configuration has the single pair of balanced terminals 8a and 8f.

According to the variation of the sixth embodiment, the impedance conversion ratio can be changed by changing the number of SAW devices connected and changing the configurations thereof. It is thus possible to realize the SAW system having the function of balun and a greater degree of freedom of impedance conversion.

The SAW devices in the first through sixth embodiments may be replaced with acoustic boundary wave devices.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An acoustic wave device comprising:
   a piezoelectric substrate;
   at least five IDTs (InterDigital Transducers) arranged on the substrate in directions of SAW (Surface Acoustic Wave) propagation; and
   two balanced terminals connected to two first IDTs that are two out of the at least five IDTs and are 180 degrees out of phase,
   one of a pair of comb electrodes of one of the two first IDTs being connected to one of the two balanced terminals, and one of a pair of comb electrodes of the other one of the two first IDTs being connected to the other one of the two balanced terminals,
   the other comb electrodes of the two first IDTs being connected in series, and
   one of a pair of comb electrodes that form an IDT that is included in the at least five IDTs and is not connected to the two first IDTs being grounded, and
   additional balanced terminals connected to comb electrodes that are not grounded and are included in at least two second IDTs that are included in the at least five IDTs and are not connected to the two first IDTs,
   wherein the two first IDTs are not adjacent to each other.

2. The acoustic wave device according to claim 1, wherein IDTs that are included in the at least two second IDTs and are in phase are connected in parallel.

3. An acoustic wave device comprising:
a piezoelectric substrate;
at least five IDTs (InterDigital Transducers) arranged on the substrate in directions of SAW (Surface Acoustic Wave) propagation; and
two balanced terminals connected to two first IDTs that are two out of the at least five IDTs and are 180 degrees out of phase,
one of a pair of comb electrodes of one of the two first IDTs being connected to one of the two balanced terminals, and one of a pair of comb electrodes of the other one of the two first IDTs being connected to the other one of the two balanced terminals,
the other comb electrodes of the two first IDTs being connected in series, and
one of a pair of comb electrodes that form an IDT that is included in the at least five IDTs and is not connected to the two first IDTs being grounded, and
an unbalanced terminal connected to comb electrodes that are not grounded and are included in at least two second IDTs that are included in the at least five IDTs and are not connected to the two first IDTs,
wherein the at least two first IDTs are connected in series via at least one third IDT that is included in the at least five IDTs and is other than the two first IDTs and the at least two second IDTs, the at least two second IDTs are connected in parallel, each of the at least two second IDTs has an odd number of electrode fingers, and the acoustic wave device includes one of a reflector and a floating electrode juxtaposed to the at least one third IDT.

4. An acoustic wave device comprising:
a piezoelectric substrate;
at least three IDTs (InterDigital Transducers) arranged on the substrate in directions of SAW (Surface Acoustic Wave) propagation; and
two balanced terminals that are connected to two first IDTs that are two out of the at least three IDTs and are 180 degrees out of phase and are not connected to IDTs other than the first IDTs among the at least three IDTs,
one of a pair of comb electrodes of each of the two first IDTs being divided into two divided comb electrodes,
one of the two divided comb electrodes of one of the two first IDTs being connected to one of the two balanced terminals, and one of the two divided comb electrodes of the other one of the two first IDTs being connected to the other one of the two balanced terminals,
the other ones of the two divided comb electrodes of the two first IDTs being connected in series, and
one of a pair of comb electrodes that form an IDT that is included in the at least three IDTs and is not connected to the two first IDTs being grounded.

5. An acoustic wave system comprising:
multiple acoustic wave devices each including at least three IDTs (InterDigital Transducers);
multiple balanced terminals respectively connected to the multiple acoustic wave devices; and
multiple unbalanced terminals respectively connected to the multiple acoustic wave devices,
the multiple acoustic wave devices connected to the multiple balanced terminals being connected in series by connecting the balanced terminals that are 180 degrees out of phase to each other so that two of the multiple balanced terminals that are 180 degrees out of phase are formed to the acoustic wave system,
the multiple unbalanced terminals being connected in parallel, and
an intermediate IDT that is one of the at least three IDTs and is not connected to corresponding two of the multiple balanced terminals in each of the multiple acoustic wave devices being provided between the IDTs connected to the corresponding two of the multiple balanced terminals.

6. An acoustic wave system comprising:
multiple acoustic wave devices each including at least three IDTs (InterDigital Transducers);
first balanced terminals respectively connected to the multiple acoustic wave devices; and
second balanced terminals respectively connected to the multiple acoustic wave devices,
the multiple acoustic wave devices connected to the first balanced terminals being connected in series by connecting the first balanced terminals that are 180 degrees out of phase to each other so that two of the first balanced terminals that are 180 degrees out of phase are formed to the acoustic wave system,
ones of the second balanced terminals that are in phase being connected in parallel, and
an intermediate IDT that is one of the at least three IDTs and is not connected to corresponding two of the first balanced terminals in each of the multiple acoustic wave devices being provided between the IDTs connected to the corresponding two of the first balanced terminals.

7. An acoustic wave system comprising:
multiple acoustic wave devices each including at least three IDTs (InterDigital Transducers);
multiple balanced terminals respectively connected to the multiple acoustic wave devices; and
multiple unbalanced terminals respectively connected to the multiple acoustic wave devices,
the multiple acoustic wave devices connected to the multiple balanced terminals being connected in series by connecting the balanced terminals that are 180 degrees out of phase to each other so that two of the multiple balanced terminals that are 180 degrees out of phase are formed to the acoustic wave system,
the multiple unbalanced terminals being connected in parallel,
each of ones of pairs of comb electrodes that form the IDTs connected to corresponding ones of the multiple balanced terminals being divided into two divided comb electrodes,
one of the two divided comb electrodes in each of the IDTs connected to the corresponding ones of the multiple balanced terminals being connected to a corresponding one of the two of the multiple balanced terminals, and
the other ones of the two divided comb electrodes in the IDTs connected to the two of the multiple balanced terminals being connected in series.

8. An acoustic wave system comprising:
multiple acoustic wave devices each including at least three IDTs (InterDigital Transducers);
first balanced terminals respectively connected to the multiple acoustic wave devices; and
second balanced terminals respectively connected to the multiple acoustic wave devices,
the multiple acoustic wave devices connected to the first balanced terminals being connected in series by connecting the first balanced terminals that are 180 degrees out of phase to each other so that two of the first balanced terminals that are 180 degrees out of phase are formed to the acoustic wave system, ones of the second balanced terminals that are in phase being connected in parallel, each of ones of pairs of comb electrodes that form the IDTs connected to corresponding ones of the first balanced terminals being divided into two divided comb electrodes, one of the two divided comb electrodes in each of the IDTs connected to the corresponding ones of the first balanced terminals being connected to a corresponding one of the two of the first balanced terminals, and the other ones of the two divided comb electrodes in the IDTs connected to the two of the first balanced terminals being connected in series.

* * * * *